United States Patent
Takei

(10) Patent No.: US 8,519,793 B2
(45) Date of Patent: Aug. 27, 2013

(54) OPERATIONAL AMPLIFIER CIRCUIT

(75) Inventor: Tatsuya Takei, Tokyo (JP)

(73) Assignee: Olympus Corporation, Tokyo (JP)

( * ) Notice: Subject to any disclaimer, the term of this patent is extended or adjusted under 35 U.S.C. 154(b) by 69 days.

(21) Appl. No.: 13/349,861

(22) Filed: Jan. 13, 2012

(65) Prior Publication Data
US 2012/0182071 A1    Jul. 19, 2012

(30) Foreign Application Priority Data

Jan. 14, 2011    (JP) .................................. 2011-005699

(51) Int. Cl.
*H03F 3/45*    (2006.01)
(52) U.S. Cl.
USPC .......................................... 330/258; 330/253
(58) Field of Classification Search
USPC ................................. 330/252–261
See application file for complete search history.

(56) References Cited

U.S. PATENT DOCUMENTS
6,265,941 B1 *    7/2001    Lopata ........................... 330/258

FOREIGN PATENT DOCUMENTS
JP    2008-125024 A    5/2008

* cited by examiner

*Primary Examiner* — Hieu Nguyen
(74) *Attorney, Agent, or Firm* — Westerman, Hattori, Daniels & Adrian, LLP

(57) ABSTRACT

An operational amplifier circuit may include a fully differential amplifier circuit that has a common mode feedback, the fully differential amplifier circuit performing operational amplification using a common mode base voltage as a center, a common mode detection circuit that detects a common mode output voltage of the fully differential amplifier circuit, a sample and hold circuit that performs sample and hold of an output of the common mode detection circuit, an operational circuit that detects a deviation between the output of the sample and hold circuit and a common mode reference voltage, the operational circuit outputting a voltage corresponding to the detected deviation and the common mode reference voltage, and a switching circuit that selects the common mode reference voltage or an output of the operational circuit to output the common mode reference voltage or the output as the common mode base voltage.

3 Claims, 5 Drawing Sheets

OPERATIONAL AMPLIFIER CIRCUIT

BACKGROUND OF THE INVENTION

1. Field of the Invention

The present invention relates to an operational amplifier circuit. More particularly, the present invention relates to a technique of correcting an output offset voltage of a fully differential folded amplifier circuit.

Priority is claimed on Japanese Patent Application No. 2011-005699, filed Jan. 14, 2011, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A fully differential amplifier circuit can obtain great output amplitude and avoid poles generated in a gate of an active load. Accordingly, a high-speed closed loop characteristic can be obtained. The fully differential amplifier circuit has a higher performance than a single-ended amplifier circuit. However, common mode feedback is necessary in order to stabilize an output voltage. Common mode feedbacks are classified into several feedbacks depending on detection schemes and feedback destinations. Common mode signal detection schemes include a resistor division scheme, a dual differential pair scheme, a linear MOS resistor scheme, etc. A detected error signal is fed back to a tail current source of a differential pair or an active load. Common mode feedback allows a fully differential amplifier circuit to output a signal using a reference voltage as a center.

A common mode feedback method for a fully differential folded amplifier circuit is disclosed in Japanese Unexamined Patent Application, First Publication No. 2008-125024. FIGS. 4 and 5 are circuit diagrams disclosed in Japanese Unexamined Patent Application, First Publication No. 2008-125024. FIG. 4 is a block diagram illustrating a schematic configuration of an operational amplifier circuit. FIG. 5 is a circuit diagram illustrating a detailed configuration of the operational amplifier circuit.

The operational amplifier circuit of FIG. 4 includes a transconductance amplifier circuit 1, an output load ZL, a common mode feedback circuit 2, and a voltage supply circuit 3.

The transconductance amplifier circuit 1 converts a differential input voltage into a differential output current. The output load ZL is connected between output terminals of the operational amplifier circuit. The differential output current of the transconductance amplifier circuit 1 is applied to the output load ZL, which outputs a differential output voltage corresponding to the differential output current. The differential output voltage of the transconductance amplifier circuit 1 generated in the output load ZL and a base voltage vref are input to the common mode feedback circuit 2. The common mode feedback circuit 2 outputs a control signal to the transconductance amplifier circuit 1 so that a DC voltage level of the differential output voltage of the transconductance amplifier circuit 1 generated in the output load ZL is the same as the base voltage vref. The voltage supply circuit 3 supplies the base voltage vref to the common mode feedback circuit 2.

Details of the circuit shown in FIG. 4 are shown in FIG. 5. The transconductance amplifier circuit 1 includes current sources I1, I2, I3, I4, I5, I6, and I7 and transistors M1, M2, M3, and M4. The output load ZL includes a resistor RL and a capacitor CL. The common mode feedback circuit 2 includes current sources I8, I9, and I10, and transistors M5, M6, M7, M8, M9, M10, M11, M12, M13, and M14. The voltage supply circuit 3 includes transistors M15 and M16.

An operation of the circuit illustrated in FIG. 5 will be described. The differential output current output from the transconductance amplifier circuit 1 is converted into a voltage signal by the resistor RL. The voltage signal converted by the resistor RL is input to the transistors M5 and M7. The voltage input to the transistors M5 and M7 is converted into an average value of the two voltages, i.e., a common mode output voltage by the current sources I8 and I9 and the transistors M5, M6, M7, M8, M11, and M12, and input to the transistor M9. The current source I10 and the transistors M9, M10, M13, and M14 change a current flowing in the transistor M14 according to a difference between the voltage input to the transistor M9 and the base voltage generated by the transistor M15 and the transistor M16 and input to the transistor M10. The current flowing in the transistor M14 is copied to the transistors M3 and M4 constituting a current mirror and the output current of the transconductance amplifier circuit 1 is adjusted. The above-described operation enables the common mode output voltage of the transconductance amplifier circuit 1 to be the same as the base voltage.

However, in the configuration disclosed in the above-described Japanese Unexamined Patent Application, First Publication No. 2008-125024, an output offset voltage is generated in the common mode output voltage due to a current error of the current source or an error caused by current mirror precision of a current mirror even though the common mode feedback is provided. Thereby, the common mode output voltage does not match the base voltage, and an output amplitude range becomes narrower.

SUMMARY

The present invention provides an operational amplifier circuit capable of correcting an output offset voltage of a common mode output voltage caused by an error of a current source or a current mirror precision error of a current mirror and capable of more accurately controlling the common mode output voltage.

An operational amplifier circuit may include: a fully differential amplifier circuit that has a common mode feedback, the fully differential amplifier circuit performing operational amplification using a common mode base voltage as a center; a common mode detection circuit that detects a common mode output voltage of the fully differential amplifier circuit; a sample and hold circuit that performs sample and hold of an output of the common mode detection circuit; an operational circuit that detects a deviation between the output of the sample and hold circuit and a common mode reference voltage, the operational circuit outputting a voltage corresponding to the detected deviation and the common mode reference voltage; and a switching circuit that selects the common mode reference voltage or an output of the operational circuit to output the common mode reference voltage or the output as the common mode base voltage. The common mode detection circuit may detect the common mode output voltage of the fully differential amplifier circuit when the switching circuit selects the common mode reference voltage and outputs the common mode reference voltage as the common mode base voltage, and then the sample and hold circuit may perform the sample and hold of the output of the common mode detection circuit. The operational circuit may output the voltage corresponding to the deviation and the common mode reference voltage. The switching circuit may select the output of the operational circuit and output the output as the common mode base voltage so that the common mode base voltage is corrected.

The fully differential amplifier circuit may include a fully differential folded amplifier circuit.

The operational circuit may include a subtraction circuit.

In the present invention, the common mode output voltage of the fully differential amplifier circuit when a common mode reference voltage is applied as a common mode base voltage to the fully differential amplifier circuit is detected. Based on a deviation between the detected common mode output voltage and the common mode reference voltage, the common mode base voltage applied to the fully differential amplifier circuit is corrected. Accordingly, the output offset voltage of the common mode output voltage can be corrected and the common mode output voltage can be controlled more accurately.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

Figure 1:
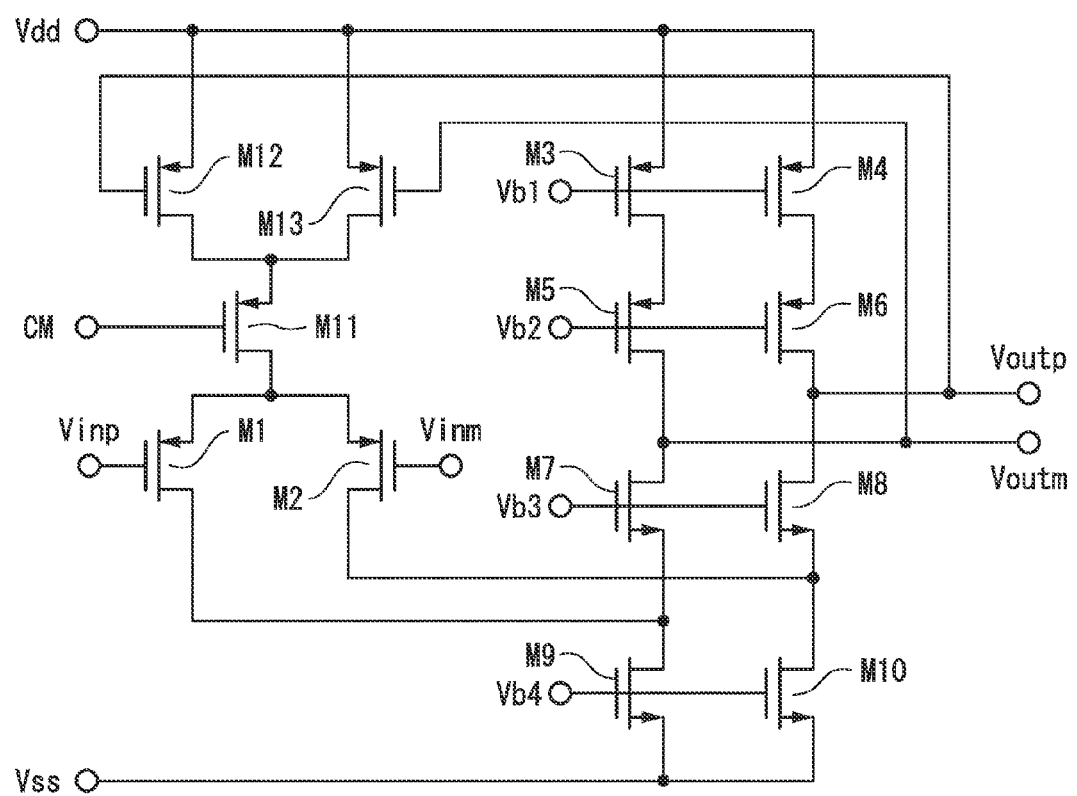
FIG. 1 is a circuit diagram illustrating an example of a configuration of a fully differential folded amplifier circuit in accordance with a first preferred embodiment of the present invention.
Figure 2:
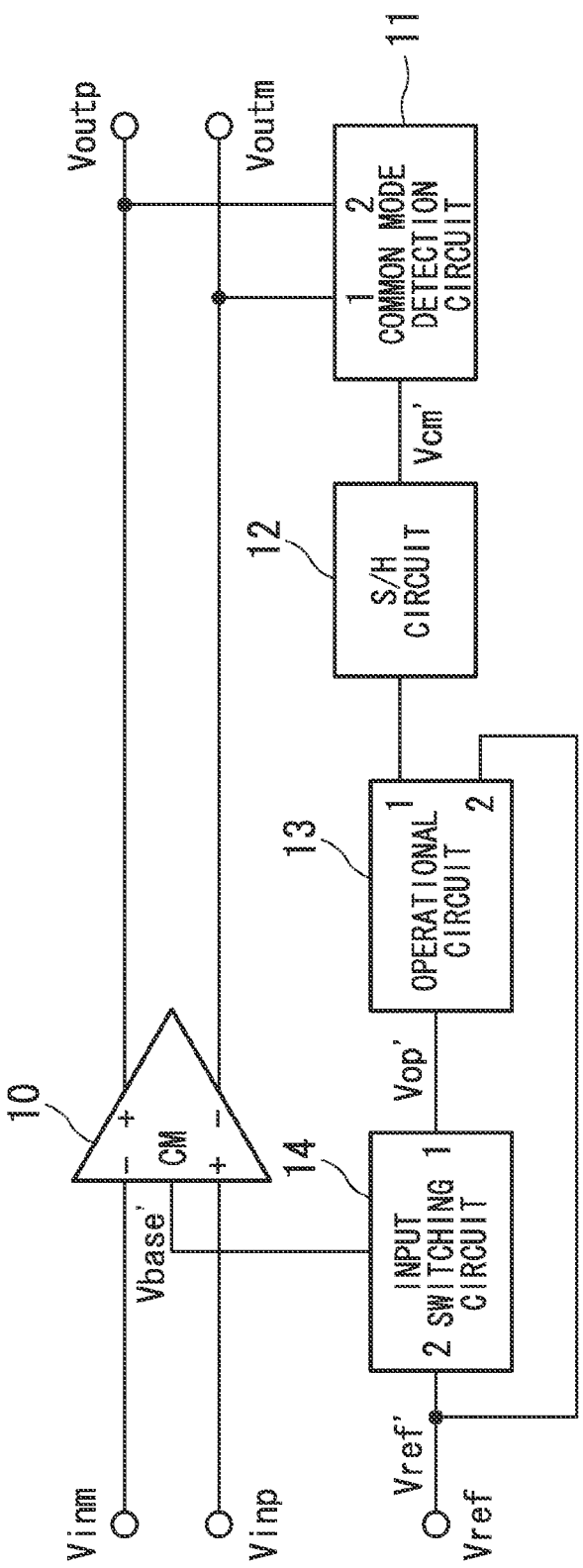
FIG. 2 is a block diagram illustrating an example of a schematic configuration of an operational amplifier circuit having the fully differential folded amplifier circuit in accordance with the first preferred embodiment of the present invention.
Figure 3:
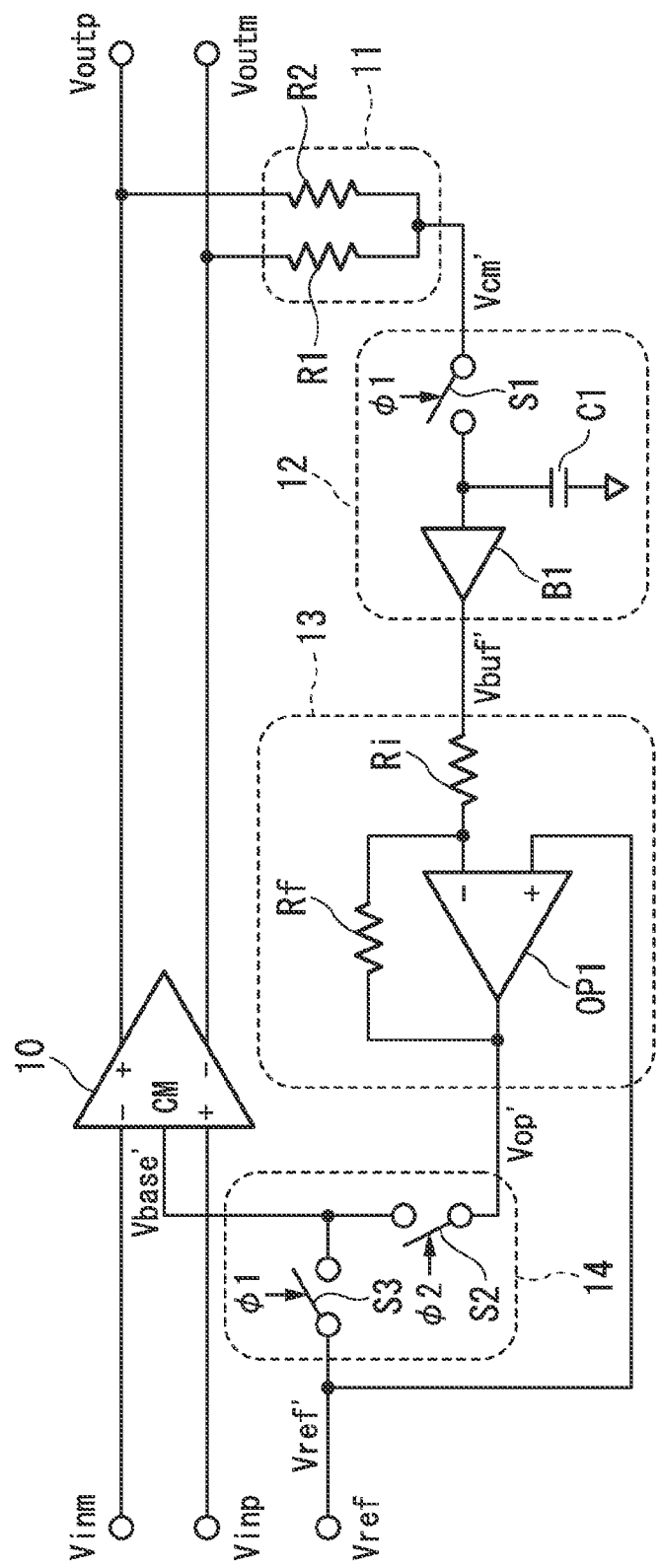
FIG. 3 is a circuit diagram illustrating a concrete example of the circuit shown in FIG. 2.
Figure 4:
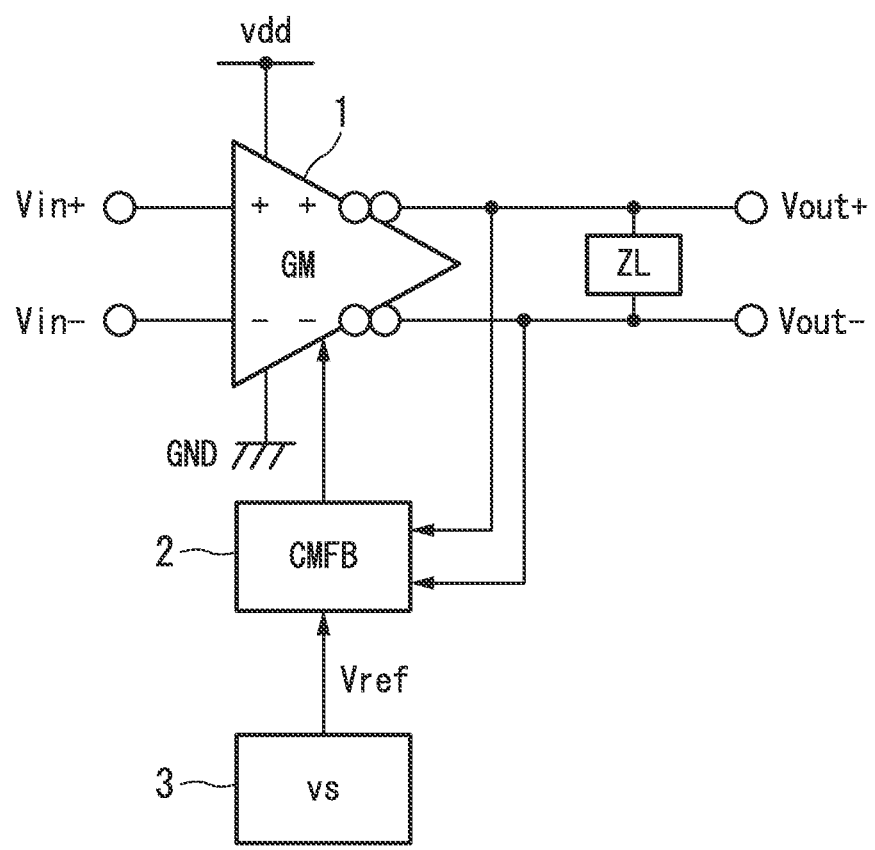
FIG. 4 is a block diagram illustrating a schematic configuration of an operational amplifier circuit in accordance with the related art.
Figure 5:
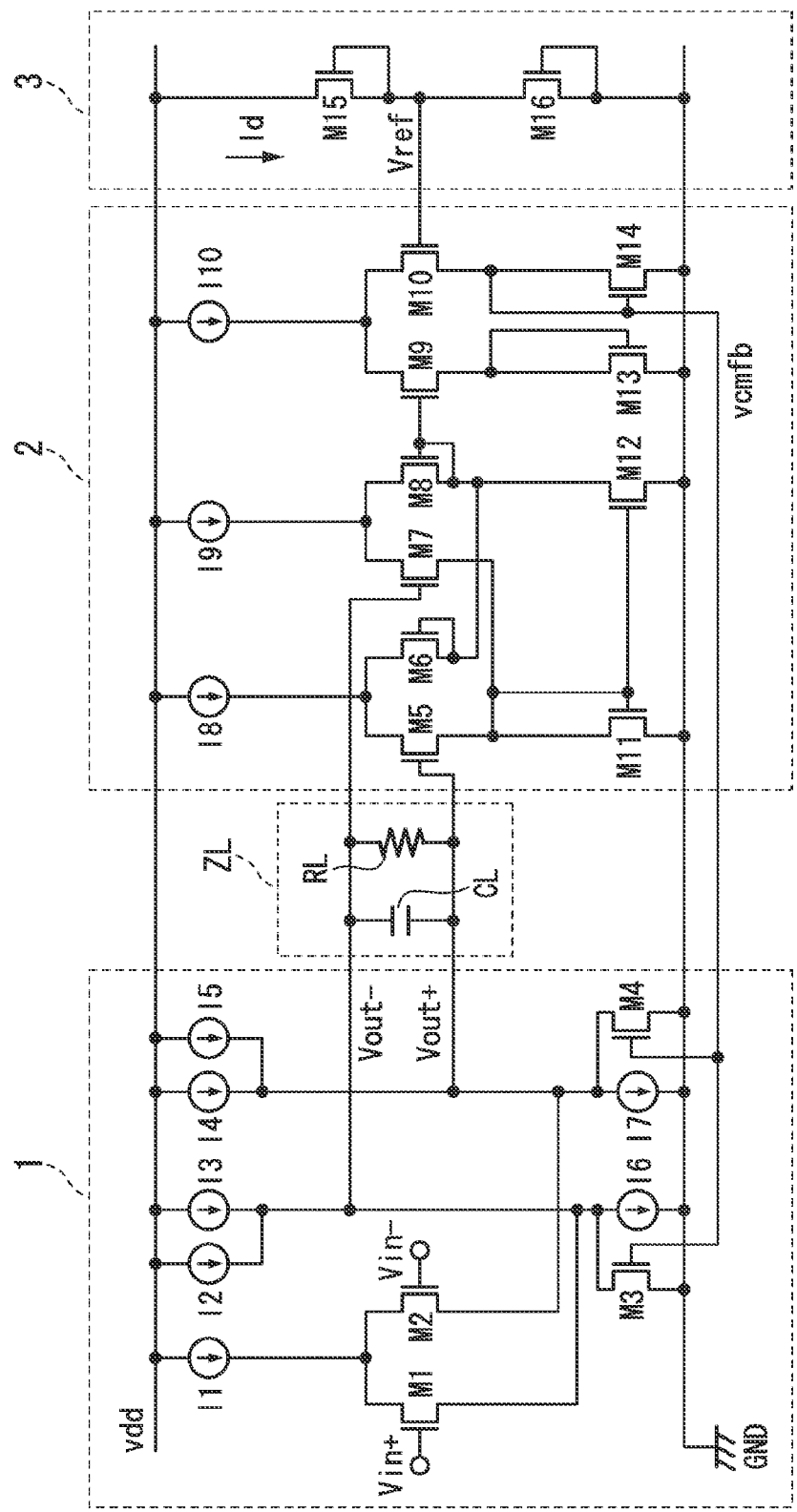
FIG. 5 is a circuit diagram illustrating a detailed configuration of the operational amplifier circuit in accordance with the related art.

Hereinafter, a first preferred embodiment of the present invention will be described with reference to the accompanying drawings. FIG. 1 is a circuit diagram illustrating an example of a configuration of a fully differential folded amplifier circuit in accordance with the first preferred embodiment of the present invention. FIG. 2 is a block diagram illustrating an example of a schematic configuration of an operational amplifier circuit having the fully differential folded amplifier circuit in accordance with the first preferred embodiment of the present invention. FIG. 3 is a circuit diagram illustrating a concrete example of the circuit shown in FIG. 2.

The fully differential folded amplifier circuit shown in FIG. 1 includes, as terminals for connection to the exterior, eleven input/output terminals such as a supply voltage terminal Vdd, a supply voltage terminal Vss, a non-inverting input terminal Vinp, an inverting input terminal Vinm, a non-inverting output terminal Voutp, an inverting output terminal Voutm, a base voltage input terminal CM, a bias voltage terminal Vb1, a bias voltage terminal Vb2, a bias voltage terminal Vb3 and a bias voltage terminal Vb4, nine PMOS transistors M1, M2, M3, M4, M5, M6, M11, M12, and M13, and four NMOS transistors M7, M8, M9, and M10.

Source terminals of the PMOS transistors M12 and M13 are connected to the supply voltage terminal Vdd. The gate terminal of the PMOS transistor M12 is connected to the non-inverting output terminal Voutp. The gate terminal of the PMOS transistor M13 is connected to the inverting output terminal Voutm. The drain terminal of the PMOS transistor M12 and the drain terminal of the PMOS transistor M13 are connected to each other and to the source terminal of the PMOS transistor M11.

The gate terminal of the PMOS transistor M11 is connected to the base voltage input terminal CM. The drain terminal of the PMOS transistor M11 is connected to the source terminals of the PMOS transistors M1 and M2. The gate of the PMOS transistor M1 is connected to the non-inverting input terminal Vinp. The drain terminal of the PMOS transistor M1 is connected to the source terminal of the NMOS transistor M7 and the drain terminal of the NMOS transistor M9. The gate terminal of the PMOS transistor M2 is connected to the inverting input terminal Vinm. The drain terminal of the PMOS transistor M2 is connected to the source terminal of the NMOS transistor M8 and the drain terminal of the NMOS transistor M10.

The gate terminal of the NMOS transistor M9 is connected to the bias voltage terminal Vb4. The source terminal of the NMOS transistor M9 is connected to the supply voltage terminal Vss. The gate terminal of the NMOS transistor M10 is connected to the bias voltage terminal Vb4. The source terminal of the NMOS transistor M10 is connected to the supply voltage terminal Vss. The gate terminal of the NMOS transistor M7 is connected to the bias voltage terminal Vb3. The drain terminal of the NMOS transistor M7 is connected to the drain terminal of the PMOS transistor M5 and the inverting output terminal Voutm. The gate terminal of the NMOS transistor M8 is connected to the bias voltage terminal Vb3. The drain terminal of the NMOS transistor M8 is connected to the drain terminal of the PMOS transistor M6 and the non-inverting output terminal Voutp.

The gate terminal of the PMOS transistor M5 is connected to the bias voltage terminal Vb2. The source terminal of the PMOS transistor M5 is connected to the drain terminal of the PMOS transistor M3. The gate terminal of the PMOS transistor M6 is connected to the bias voltage terminal Vb2. The source terminal of the PMOS transistor M6 is connected to the drain terminal of the PMOPS transistor M4. The gate terminal of the PMOS transistor M3 is connected to the bias voltage terminal Vb1. The source terminal of the PMOS transistor M3 is connected to the supply voltage terminal Vdd. The gate terminal of the PMOS transistor M4 is connected to the bias voltage terminal Vb1. The source terminal of the PMOS transistor M4 is connected to the supply voltage terminal Vdd.

Next, a common mode feedback operation in the above-described fully differential amplifier circuit will be described. In the following description, an input voltage to the base voltage input terminal is Vcm', and the average value of an output voltage from the non-inverting output terminal and an output voltage from the inverting output terminal is Voutcm'.

Here, if Voutcm' is higher than Vcm', the voltage applied to the gate terminals of the PMOS transistor M12 and the PMOS transistor M13 increases and the current flowing in the PMOS transistor M12 and the PMOS transistor M13 decreases. This decrease in current directly causes a decrease in current flowing in the PMOS transistor M1 and the PMOS transistor M2, and accordingly, Voutcm' decreases. Conversely, if Voutcm' is lower than Vcm', the voltage applied to the gate terminals of the PMOS transistor M12 and the PMOS transistor M13 decreases and the current flowing in the PMOS transistor M12 and the PMOS transistor M13 increases. This increase in current directly causes an increase in current flowing in the PMOS transistor M1 and the PMOS transistor M2, and accordingly, Voutcm' increases. Thus, the fully differential amplifier circuit realizes the common mode feedback to cause Voutcm' to match Vcm'.

Next, an operation of the operational amplifier circuit of the first preferred embodiment will be described with reference to FIG. 2. The operational amplifier circuit shown in FIG. 2 has common mode feedback. The operational amplifier circuit includes a fully differential amplifier circuit 10 for performing operational amplification using a common mode base voltage as a center, a common mode detection circuit 11, an S/H circuit (a sample and hold circuit) 12, an operational circuit 13, an input switching circuit 14, a non-inverting input terminal Vinp, an inverting input terminal Vinm, a non-inverting output terminal Voutp, an inverting output terminal Voutm, and a reference voltage terminal Vref. The non-inverting input terminal Vinp, the inverting input terminal Vinm, the non-inverting output terminal Voutp, the inverting output terminal Voutm, and the reference voltage terminal Vref are signal input/output terminals. Further, in order to cause the fully differential amplifier circuit to stably operate with the desired characteristics, it is necessary to provide feedback using, for example, a capacitor. However, for simplicity of explanation, the feedback is omitted in FIG. 2.

An inverting input of the fully differential amplifier circuit 10 is connected to the inverting input terminal Vinm. A non-inverting input of the fully differential amplifier circuit 10 is connected to the non-inverting input terminal Vinp. A non-inverting output of the fully differential amplifier circuit 10 is connected to the non-inverting output terminal Voutp. An inverting output of the fully differential amplifier circuit is connected to the inverting output terminal Voutm.

An input 1 of the common mode detection circuit 11 is connected to the inverting output terminal Voutm. An input 2 of the common mode detection circuit 11 is connected to the non-inverting output terminal Voutp. An output of the common mode detection circuit 11 is connected to an input of the S/H circuit 12. An output of the S/H circuit 12 is connected to an input 1 of the operational circuit 13. An input 2 of the operational circuit 13 is connected to the reference voltage terminal Vref. An output of the operational circuit 13 is connected to an input 1 of the input switching circuit 14. An input 2 of the input switching circuit 14 is connected to the reference voltage terminal Vref. An output of the input switching circuit 14 is connected to a common mode input of the fully differential amplifier circuit 10.

Hereinafter, a procedure of correcting a common mode output voltage will be described. In the following description, an output voltage (a common mode reference voltage) from the reference voltage terminal Vref is Vref', an input voltage (a common mode base voltage) to the common mode input of the fully differential amplifier circuit 10 is Vbase', a common mode output voltage of the fully differential amplifier circuit 10 is Vcm', an output offset voltage generated in the fully differential amplifier circuit 10 is Verr', and an output voltage of the operational circuit 13 is Vop'.

In correction of the common mode output voltage, first, the input switching circuit 14 selects Vref' and outputs Vref' as Vbase' to the common mode input of the fully differential amplifier circuit 10. The common mode detection circuit 11 detects Vcm', which is the common mode output voltage at that time, and the S/H circuit 12 samples Vcm'. Subsequently, the S/H circuit 12 holds the sampled Vcm' and outputs Vcm' as an output voltage to the operational circuit 13. The operational circuit 13 outputs Vop' obtained by changing Vref' by a difference (deviation) between Vcm' and Vref', that is, an output offset voltage Verr. Last, the input switching circuit 14 selects Vop' and outputs Vop' as Vbase' to the common mode input of the fully differential amplifier circuit 10. Accordingly, Vop', which is obtained by correcting Vref', is input to the common mode input of the fully differential amplifier circuit 10, and the common mode output voltage Vcm' of the fully differential amplifier circuit 10 is corrected to a desired value.

Next, a concrete operation of the operational amplifier circuit of the first preferred embodiment will be described with reference to FIG. 3. FIG. 3 illustrates an example of a concrete circuit of the block diagram shown in FIG. 2. The circuit shown in FIG. 3 has common mode feedback. The operational amplifier circuit includes a fully differential amplifier circuit 10 for performing operational amplification using a common mode base voltage as a center, a common mode detection circuit 11, an S/H circuit 12, an operational circuit 13, an input switching circuit 14, a non-inverting input terminal Vinp, an inverting input terminal Vinm, a non-inverting output terminal Voutp, an inverting output terminal Voutm, a reference voltage terminal Vref, a supply voltage terminal GND, and control signals φ1 and φ2. The non-inverting input terminal Vinp, the inverting input terminal Vinm, the non-inverting output terminal Voutp, the inverting output terminal Voutm, the reference voltage terminal Vref, and the supply voltage terminal GND are signal input/output terminals.

The common mode detection circuit 11 includes resistors R1 and R2 having the same resistance. The S/H circuit 12 includes a switch S1, a capacitor C1, and a buffer circuit B1. The operational circuit 13 includes an operational amplifier OP1, an input resistor Ri, and a feedback resistor Rf. The input switching circuit 14 includes a switch S2 and a switch S3. Further, in order to cause the fully differential amplifier circuit to stably operate with a desired characteristic, it is necessary to provide feedback using, for example, a capacitor. However, for simplicity of explanation, the feedback is omitted in FIG. 3.

An inverting input of the fully differential amplifier circuit 10 is connected to the inverting input terminal Vinm. A non-inverting input of the fully differential amplifier circuit 10 is connected to the non-inverting input terminal Vinp. A non-inverting output of the fully differential amplifier circuit 10 is connected to a non-inverting output terminal Voutp. An inverting output of the fully differential amplifier circuit 10 is connected to an inverting output terminal Voutm.

One terminal of the resistor R1 is connected to the inverting output terminal Voutm. One terminal of the resistor R2 is connected to the non-inverting output terminal Voutp. The other terminal of the resistor R1 is connected to the other terminal of the resistor R2. One terminal of the switch S1 is connected to the other terminal of the resistor R1 and the other terminal of the resistor R2. The other terminal of the switch S1 is connected to one terminal of the capacitor C1 and an input terminal of the buffer B1. The other terminal of the capacitor C1 is connected to the supply voltage terminal GND. An output of the buffer B1 is connected to one terminal of the resistor Ri.

The other terminal of the resistor Ri is connected to an inverting input of the operational amplifier OP1 and one terminal of the resistor Rf. The other terminal of the resistor Rf is connected to an output of the operational amplifier OP1. A non-inverting input of the operational amplifier OP1 is connected to the reference voltage terminal Vref.

One terminal of the switch S2 is connected to the output of the operational amplifier OP1. The other terminal of the switch S2 is connected to the common mode input of the fully differential amplifier circuit 10. One terminal of the switch S3 is connected to the reference voltage terminal Vref. The other terminal of the switch S3 is connected to the common mode input of the fully differential amplifier circuit 10.

On and off states of the switch S1 and the switch S3 are controlled by a control signal $\phi 1$. On and off states of the switch S2 are controlled by a control signal $\phi 2$ having a reverse phase relationship to the control signal $\phi 1$.

Next, a concrete procedure of correcting a common mode output voltage will be described. In the following description, an output voltage from the reference voltage terminal Vref is Vref', an input voltage (common mode base voltage) to the common mode input of the fully differential amplifier circuit 10 is Vbase', the common mode output voltage of the fully differential amplifier circuit 10 is Vcm', an output offset voltage generated in the fully differential amplifier circuit 10 is Verr', an output voltage of the buffer B1 is Vbuf', and an output voltage the operational circuit 13 is Vop'.

In correction of the common mode output voltage, first, the switch S1 and the switch S3 enter an on state by the control signal $\phi 1$, and the switch S2 becomes in an off state by the control signal $\phi 2$, such that the reference voltage terminal Vref is connected to the common mode input of the fully differential amplifier circuit 10. Accordingly, Vbase' is expressed as in Equation (1).

$$Vbase'=Vref' \qquad (1)$$

In this state, Vcm' detected by the resistor R1 and the resistor R2 having the same resistance is Vbase' plus Verr'. That is, Vcm' is expressed as in Equation (2).

$$Vcm'=Vbase'+Verr'=Vref'+Verr' \qquad (2)$$

The detected Vcm' is accumulated in the capacitor C1 via the switch S1.

Subsequently, if the switch S1 and the switch S3 enter an off state by the control signal $\phi 1$ and the switch S2 enters an on state by the control signal $\phi 2$, a voltage corresponding to charges accumulated in the capacitor C1 is output from the buffer B1. Here, if the input resistor Ri and the feedback resistor Rf have the same resistance, Vbuf' is expressed as in Equation (3) and Vop' is expressed as in Equation (4).

$$Vbuf'=Vref'+Verr' \qquad (3)$$

$$Vop'=Vref'+(Vref'-Vbuf')=Vref'-Verr' \qquad (4)$$

As shown in Equation (4), the operational circuit 13 detects a deviation (Vref'-Vbuf') between an output (Vbuf') of the S/H circuit 12 and Vref', and outputs a voltage (Vref'+(Vref'-Vbuf')) based on the detected deviation and Vref', i.e., (Vref'-Verr'). In this case, since the output terminal of the operational amplifier OP1 is connected to the common mode input of the fully differential amplifier circuit 10, Vbase' is expressed as in Equation (5).

$$Vbase'=Vref'-Verr' \qquad (5)$$

That is, the value obtained by subtracting Verr' from Vref' is output. Accordingly, Vcm' in this state is expressed as in Equation (6).

$$Vcm'=Vbase'+Verr'=Vref'-Verr'+Verr'=Vref' \qquad (6)$$

Accordingly, the common mode output voltage of the fully differential amplifier circuit 10 is corrected to a desired value. In the description using FIG. 3, a subtraction circuit is used as the operational circuit 13. For example, the operational circuit 13 is configured using a conversion table in which a correspondence relationship between inputs Vbuf' and Vref' of the operational circuit 13 and the output of the operational circuit 13 has been recorded in advance, and the correction may be performed using an output obtained by converting Vbuf' and Vref' input to the operational circuit 13 using the conversion table.

As described above, according to the circuit configuration of the first preferred embodiment, the output offset voltage, which is an error of the common mode output voltage caused by a current mirror ratio of a current source, can be corrected, and the common mode output voltage can be controlled more accurately compared to a conventional circuit.

Further, according to the circuit configuration of the first preferred embodiment, the output offset voltage generated in the fully differential folded amplifier circuit can be corrected and the common mode output voltage can be controlled more accurately.

Furthermore, according to the circuit configuration of the first preferred embodiment, the operational circuit 13 includes a subtraction circuit, such that the output offset voltage can be corrected with a simple circuit and the common mode output voltage can be controlled more accurately.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. An operational amplifier circuit comprising:
a fully differential amplifier circuit that has a common mode feedback, the fully differential amplifier circuit performing operational amplification using a common mode base voltage as a center;
a common mode detection circuit that detects a common mode output voltage of the fully differential amplifier circuit;
a sample and hold circuit that performs sample and hold of an output of the common mode detection circuit;
an operational circuit that detects a deviation between the output of the sample and hold circuit and a common mode reference voltage, the operational circuit outputting a voltage corresponding to the detected deviation and the common mode reference voltage; and
a switching circuit that selects the common mode reference voltage or an output of the operational circuit to output the common mode reference voltage or the output as the common mode base voltage,
wherein the common mode detection circuit detects the common mode output voltage of the fully differential amplifier circuit when the switching circuit selects the common mode reference voltage and outputs the common mode reference voltage as the common mode base voltage, and then the sample and hold circuit performs the sample and hold of the output of the common mode detection circuit, the operational circuit outputs the voltage corresponding to the deviation and the common mode reference voltage, and the switching circuit selects the output of the operational circuit and outputs the output as the common mode base voltage so that the common mode base voltage is corrected.

2. The operational amplifier circuit according to claim 1, wherein the fully differential amplifier circuit comprises a fully differential folded amplifier circuit.

3. The operational amplifier circuit according to claim 1, wherein the operational circuit comprises a subtraction circuit.

* * * * *